United States Patent [19]
Lee et al.

[11] Patent Number: 5,808,476
[45] Date of Patent: Sep. 15, 1998

[54] BUILT-IN CURRENT SENSOR FOR IDDQ MONITORING

[75] Inventors: Kuen-Jong Lee; Jing-Jou Tang, both of Tainan, Taiwan

[73] Assignee: National Science Council, Taipei, Taiwan

[21] Appl. No.: 688,101

[22] Filed: Jul. 29, 1996

[51] Int. Cl.[6] .................................................. G01R 31/26
[52] U.S. Cl. ............................................................ 324/765
[58] Field of Search .................................. 324/765, 763, 324/158.1; 371/22.5, 22.6

[56] References Cited

U.S. PATENT DOCUMENTS

| | | | |
|---|---|---|---|
| 4,631,724 | 12/1986 | Shimizu | 371/21 |
| 5,025,344 | 6/1991 | Maly et al. | 361/88 |
| 5,057,774 | 10/1991 | Verhelst | 324/158.1 |
| 5,111,136 | 5/1992 | Kawashima | 324/158.1 |
| 5,321,354 | 6/1994 | Ooshima et al. | 324/158.1 |
| 5,332,973 | 7/1994 | Brown et al. | 324/537 |
| 5,386,158 | 1/1995 | Wang | 327/51 |
| 5,392,293 | 2/1995 | Hsue | 371/15.1 |
| 5,519,333 | 5/1996 | Righter | 324/765 |

*Primary Examiner*—Vinh P. Nguyen
*Assistant Examiner*—Anh Phung
*Attorney, Agent, or Firm*—Beveridge, DeGrandi, Weilacher & Young, LLP

[57] ABSTRACT

An apparatus for measuring the current of a CMOS circuit includes a reference current generator to generate a reference current, a first current mirror to mirror the reference current, a second current mirror to mirror the current consumed by the CMOS circuit, an inverter to compare the above two mirrored currents and generate a signal to indicate which current is larger, and a multiplexer to switch between the normal circuit operation mode and the test mode. By this apparatus, it is possible to measure rapidly and accurately whether the CMOS circuit consumes an abnormally large current, thereby determining whether the CMOS circuit contains defects. This apparatus is based on the current-mode approach, hence can provide a high speed signal processing capability and has lower sensitivity to parameter deviation caused by process or operating temperature variations. It also provides scaleable sensing resolutions and programmable current reference.

12 Claims, 1 Drawing Sheet

BUILT-IN CURRENT SENSOR FOR IDDQ MONITORING

FIELD OF THE INVENTION

The present invention relates generally to a current sensor for use in a CMOS circuit, and more particularly to a built-in current sensor for the CMOS circuit.

BACKGROUND OF THE INVENTION

The conventional testing method for detecting a fault of a CMOS circuit is based on logic testing, in which the output logic values of a circuit under test (CUT) are observed. Such a conventional testing method as described above is incapable of detecting a CMOS fault that results in an intermediate voltage value between VDD (logic 1) and GND (logic 0).

Recently many academic and industrial experiments have shown that such an intermediate fault as described above can be detected by the IDDQ current testing method, which is used in conjunction with some automatic testing equipment (ATE) or built-in current sensors (BICS). The employment of automatic testing equipment can result in a substantial reduction in the testing speed and the sensing resolution of the measurable current. Therefore many efforts have been put on the invention of effective BICS.

Previous BICS mainly use the "voltage-mode" approach, in which the signals under consideration are processed in forms of voltages. Examples of these voltage-mode BICS include the following U.S. patents: 1991 U.S. Pat. No. 5,025,344, 1991 U.S. Pat. No. 5,057,774, 1993 U.S. Pat. No. 5,230,000, 1993 U.S. Pat. No. 5,332,973, 1994 U.S. Pat. No. 5,332,973, etc. The main problems of these BICS are the slow detection speed and the incapability of resisting noise and process variation. Also most of these designs are quite complex. Yet two other problems of these designs are that their current resolution is not easy to adjust and that the external voltage or reference current is not easy to control.

SUMMARY OF THE INVENTION

It is therefore the primary objective of the present invention to provide a BICS for CMOS circuits which is capable of high-speed testing.

It is another objective of the present invention to provide a BICS for CMOS circuits which is insensitive to the noise or process variation.

It is also another objective of the present invention to provide a BICS for CMOS circuits which can be made economically.

It is yet another objective of the present invention to provide a BICS for CMOS circuits whose resolution is easy to control.

It is still another objective of the present invention to provide a BICS for CMOS circuits which has easily programmable reference current.

In keeping with the principles of the present invention, the foregoing objectives are achieved by a preferred embodiment, which is merely illustrative and not restrictive.

According to the preferred embodiment of the present invention, the BICS for CMOS circuits comprises a reference current generator, a first current mirror, a second current mirror, a multiplexer, and an inverter.

The reference current generator has a control end which is connected to an external reference voltage, and an input end which is connected to a power source (VDD). The reference current generator further has an output end.

The first current mirror has an input end which is connected to ground (GND) and two signal ends: a first signal end and a second signal end. The first signal end is connected to the output end of the reference current generator.

The multiplexer consists of two switches. The first switch of the multiplexer has one control end and two signal ends: a first signal end and a second signal end. The first signal end is connected to VDD and the second signal end is connected to the circuit under test (CUT). The second switch of the multiplexer also has one control end and two signal ends, a first signal end and a second signal end. The first signal end is connected to the CUT and hence to the second signal end of the first switch too. The control ends of the two switches are connected to a pair of complementary input signals, respectively.

The second current mirror has two signal ends, one first signal end which is connected to the second signal end of the second switch of the multiplexer, and one second signal end which is connected to the second signal end of the first current mirror. The second current mirror further has an input end which is connected to VDD.

The inverter has an input end which is connected to both the second signal end of the first current mirror and the second signal end of the second current mirror. The inverter further has an output end.

A reference current named Iref can be generated at the output of the reference current generator with a value under the control of an external reference voltage (Vref) which is connected to the control end of the reference current generator. Iref is further applied to the first signal end of the first current mirror. Due to the current mirror effect, a current will flow into the first current mirror through its second signal end. This current is named I1.

The multiplexer can be operated in two operational modes. In the first operational mode (normal mode) the first switch of the multiplexer is turned on and the second switch of the multiplexer is turned off. Hence during the normal mode operation VDD is connected to the circuit under test (CUT), and the second current mirror is disconnected from the CUT. Therefore in the normal mode the current consumed by the CUT is provided by VDD through the first switch of the multiplexer.

In the second operational mode (test mode) the second switch of the multiplexer is turned on and the first switch is turned off. Hence the second signal end of the second current mirror is connected to the CUT. Therefore in the test mode the current consumed by the CUT is provided by VDD through the second current mirror and the second switch of the multiplexer. This current is named IDD.

Due to the current mirror effect a current will flow out of the second current mirror through its second signal end. This current is named I2.

When I2>I1, a current with a value equal to I2−I1, which is named Id, will flow into the input of the inverter and thereby a first logic voltage is delivered by the inverter. When I1<I2, Id becomes negative and a net current will flow out of the inverter through its input end, thereby a second logic voltage which is different from the first logic voltage, is given forth by the inverter.

In the preferred embodiment of the present invention, it is suggested that the switches of the multiplexer referred to above are preferably MOS transistors, and more preferably PMOS transistors. It is also suggested that the reference current generator referred to above is a MOS transistor, and more preferably an NMOS transistor.

Also preferably, the first current mirror referred to above comprises two MOS transistors with their gate terminals connected to each other, and more preferably the two MOS transistors are NMOS transistors.

Still preferably, the second current mirror referred to above comprises two MOS transistors with their gate terminals connected to each other, and more preferably the two MOS transistors are PMOS transistors.

Finally it is suggested that the inverter referred to above is a CMOS inverter.

Due to the fact that the input impedance of the inverter is almost infinite, the Id current will be very small and I1 will be almost the same as I2. This means that if Iref is not equal to IDD, then only one of the current mirrors will be fully operated, i.e., either Iref will be copied to I1 or IDD will be copied to I2, but not both.

If initially Iref>IDD, then I1>I2=IDD. When Iref decreases, I1 will decrease. Whenever Iref is decreased to slightly less than IDD, I1 will become less than I2 and thus the input capacitance of the inverter will be immediately changed, which results in the first logic voltage at the output of the inverter. Conversely if Iref increases to greater than IDD, the input capacitance of the inverter will be discharged and the output of the inverter will deliver the second logic voltage.

Since the input capacitance of the inverter is in general very small and the current copy process is very fast, the BICS of the present invention is capable of a high-speed detection of an abnormal current.

Also the BICS of the present invention is insensitive to the noise or process variation due to the use of current mirrors. In addition, the BICS of the present invention is so simple in construction that the BICS takes up a relatively small space of an integrated circuit into which the BICS of the present invention is incorporated. Furthermore, because of the high input impedance of the inverter and the utilization of current mirrors, even a very small difference between Iref and IDD will be distinguished. Therefore the BICS of the present invention can achieve very high resolution, and the resolution is easy to control by adjusting the dimensions of the current mirrors. Moreover the reference current of the BICS of the present invention can be easily programmed by controlling the external reference voltage.

The foregoing objectives, features, functions and advantages of the present invention will be more readily understood upon a thoughtful deliberation of the following detailed description of the embodiment of the present invention in conjunction with the accompanying drawing.

DETAILED DESCRIPTION OF THE PREFERRED EMBODIMENT

Figure 1:
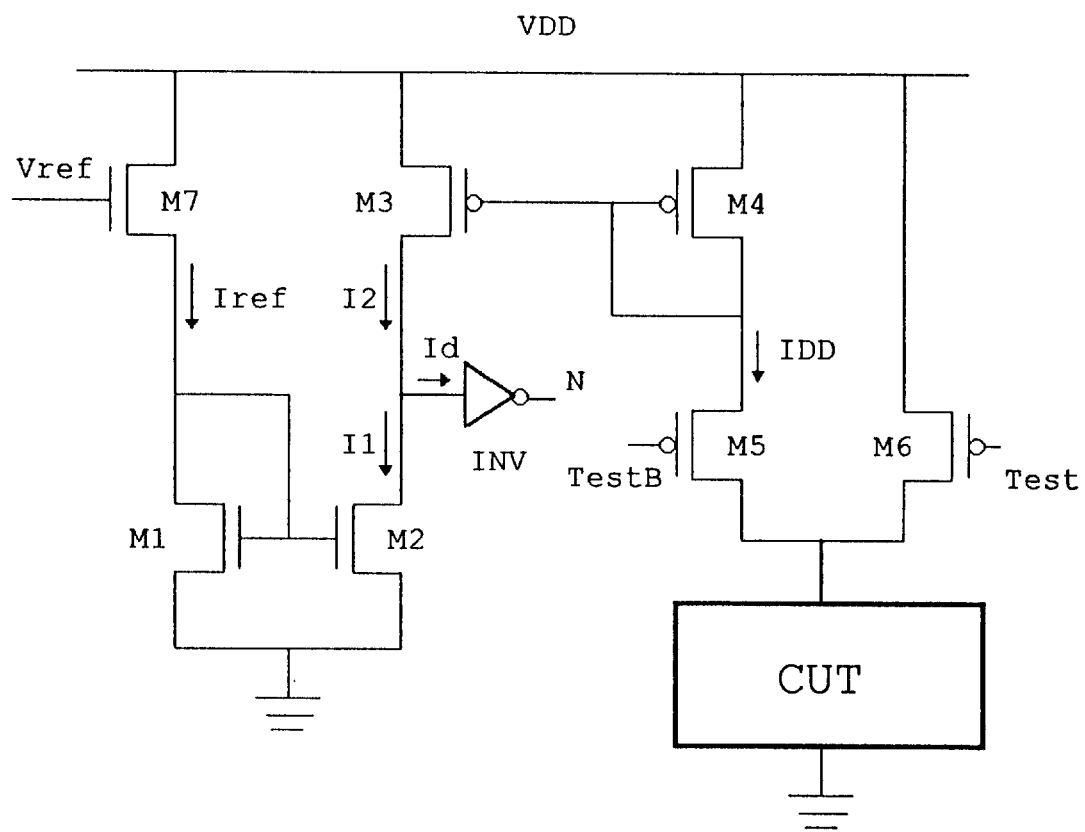
FIG. 1 shows a circuitry of the built-in current sensor for CMOS circuits of the preferred embodiment of the present invention.

As shown in FIG. 1, a built-in current sensor of the preferred embodiment comprises the component parts which are described explicitly hereafter.

According to the preferred embodiment of the present invention, the BICS for CMOS circuits comprises a reference current generator, a first current mirror, a second current mirror, a multiplexer, and an inverter.

As shown in FIG. 1, the reference current generator is an NMOS transistor named M7 which has a control end connected to an external reference voltage Vref, and an input end connected to a power source (VDD). The reference current generator further has an output end to deliver a reference current Iref. In the preferred embodiment of the present invention, the control end, the input end and the output end of M7 are the source, gate and drain terminals of M7, respectively.

The first current mirror consists of two NMOS transistors M1 and M2, and has an input end which is connected to ground (GND), a first signal end which is connected to the output end of the above mentioned reference current generator, and a second signal end which provides a mirrored current named I1. To implement the current mirror effect the gate terminals of M1 and M2 are connected together, and these two terminals are further connected to the drain terminal of M1. Both the source terminals of M1 and M2 are connected to GND. The second signal end of the first current mirror is the drain terminal of M2.

The multiplexer consists of two switches which are two PMOS transistors M5 and M6. The first switch of the multiplexer is the transistor M6 which has one control end and two signal ends: a first signal end and a second signal end. The first signal end of M6 is connected to VDD and the second signal end of M6 is connected to the CUT. The second switch of the multiplexer is the transistor M5 which also has one control end and two signal ends: a first signal end and a second signal end. The first signal end of M5 is connected to the second signal end of M6 and hence also to the CUT. The control ends of the two switches are connected to a pair of complementary input signals Test and TestB, respectively. In particular, the control end of M5 is connected to the input signal end TestB and the control end of M6 is connected to the input signal Test. In FIG. 1, the control end, the first signal end and the second end of the first switch is the gate, source and drain terminals of M5, respectively. Also, the control, the first signal end and the second signal end of the second switch are the gate, drain and source terminals of M6, respectively. The current flowing through the transistor M5 is denoted as IDD.

The second current mirror consists of two PMOS transistors M3 and M4, and has one input end which is connected to VDD and two signal ends: a first signal end and a second signal end. The first signal is connected to the second signal end of the second switch of the multiplexer, i.e., the source terminal of M5. The second signal end is connected to the second signal end of the first current mirror, i.e., the drain terminal of M2. In FIG. 1 the sources of both M3 and M4 are connected together and serve as the input signal end of the second current mirror which is connected to VDD. The gates of M3 and M4 are connected together and further connected to the drain terminal of M4 to implement the current mirror effect. The drain terminal of M3 is the second signal end of the second current mirror, which has a current I2 through it.

The inverter, denoted as INV is FIG. 1, has an input which is connected to both the second signal end of the first current mirror, i.e., the drain terminal of M2, and the second signal end of the second current mirror, i.e., the drain terminal of M3. The current flows into the inverter is denoted as Id and the output of the inverter is denoted as N.

By the above arrangement, the reference current named Iref can be generated at the drain terminal of M7 with a value under the control of Vref. Iref is further applied to the first signal end of the first current mirror. Due to the current mirror effect, the current I1 will flow into the first current mirror through its second signal end as depicted in FIG. 1.

The multiplexer can be operated in two operational modes. In the first operational mode (normal mode), the signals Test and TestB are set to logic 0 and logic 1, respectively. Thus M6 is turned on and M5 is turned off. Hence during the normal mode operation VDD is connected to the circuit under test (CUT), and the second current mirror is disconnected from the CUT. Therefore in the normal mode the current consumed by the CUT is provided by VDD through M6. In the second operational mode (test mode), the signals Test and TestB are set to logic 1 and logic 0, respectively. Thus M5 is turned on and M6 is turned off. Hence the second signal end of the second current mirror is connected to the CUT. Therefore in the test mode the current consumed by the CUT is provided by VDD through the second current mirror and M5. This current is named IDD.

Due to the current mirror effect, during the test mode a current will flow out of the second current mirror through its second signal end. This current is named I2.

When I2>I1, a current with a value equal to I2−I1, which is named Id, will flow into the input of the inverter and thereby a first logic voltage is delivered by the inverter through N. In particular, the first logic is logic 0. When I1<I2, Id becomes negative and a net current will flow out of the inverter through its input end, thereby a second logic voltage which is different from the first logic voltage, is given forth by the inverter. In particular the second logic is logic 1.

Due to the fact that the input impedance of the inverter is almost infinite, the Id current will be very small and I1 will be almost the same as I2. This means that if Iref is not equal to IDD then only one of the current mirrors will be fully operated, i.e., either Iref will be copied to I1, or IDD will be copied to I2, but not both.

If initially Iref>IDD, then I1>I2=IDD. When Iref decreases, I1 will decrease. Whenever Iref is decreased to slightly less than IDD, I1 will become less than I2 and thus the input capacitance of the inverter will be immediately changed, which results in logic 0 at the output of the inverter. Conversely if Iref increases to greater than IDD, the output of the inverter will deliver a logic 1.

Since the input capacitance of the inverter is generally very small and the current copy process is very fast, the BICS of the present invention is capable of a high-speed detection of an abnormal current. Also the BICS of the present invention is insensitive to the noise or process variation due to the use of current mirrors. In addition, the BICS of the present invention is so simple in construction that the BICS takes up a relatively small space of an integrated circuit into which the BICS of the present invention is incorporated. Furthermore, because of the high input impedance of the inverter and the utilization of current mirrors, even a very small difference between Iref and IDD will be distinguished. Therefore the BICS of the present invention can achieve very high resolution, and the resolution is easy to control by adjusting the dimension of the current mirrors. Moreover the reference current of the BICS of the present invention can be easily programmed by controlling the external reference voltage.

What claimed are:

1. A built-in current sensor for measuring the current of a CMOS circuit under test (CUT), said sensor comprising:
   a reference current generator having
      a control end connected to an external reference voltage,
      an input end connected to a power source, and
      an output end;
   a first current mirror having
      an input signal end connected to ground,
      a first signal end connected to said output end of said reference current generator, and
      a second signal end;
   a second current mirror having
      an input end connected to the power source,
      a first signal end, and
      a second signal end connected to said second signal end of said first current mirror;
   an inverter connected to said second signal end of said first current mirror and said second signal end of said second current mirror, whereby said inverter outputs a first logic value when the inputted current from said second signal end of said first current mirror and said second signal end of said second current mirror is greater than zero, said inverter outputs a second logic value when the inputted current from said second signal end of said first current mirror and said second signal end of said second current mirror is less than zero; and
   a multiplexer having
      a first switch including a control end connected to a first input signal, a first signal end connected to the external reference voltage, and a second signal end connected to the circuit under test (CUT), and
      a second switch including a control end connected to a second input signal, a first signal end connected to the circuit under test (CUT), and a second signal end connected to said first signal end of said second current mirror.

2. The built-in current sensor according to claim 1, wherein said first logic value and said second logic value outputted by said inverter are complementary to each other.

3. The built-in current sensor according to claim 1, wherein said reference current generator produces a reference current based on a value of the external reference voltage.

4. The built-in current sensor according to claim 1, wherein said control end of said first switch and said control end of said second switch operate to a manner to have only one of said first switch and said second switch operating to provide a normal mode and a test mode.

5. The built-in current sensor according to claim 1, wherein said reference current generator consisting of one NMOS transistor having a gate for said control end, a drain for said input end, and a source for said output end.

6. The built-in current sensor according to claim 1, wherein said reference current generator consists of one NMOS transistor having a gate for said control end, a source for said input end, and a drain for said output end.

7. The built-in current sensor according to claim 1, wherein said first current mirror consists of
   a first NMOS transistor having a drain for said first signal end, a gate connected to said drain, and a source; and
   a second NMOS transistor having a drain for said second signal end, a gate connected to said gate of said first NMOS transistor and said drain of said first NMOS transistor, and a source;
   said source of said first NMOS transistor and said source of said second NMOS transistor connected together to form said input end.

8. The built-in current sensor according to claim 1, wherein said first current mirror consists of
   a first NMOS transistor having a source for said first signal end, a gate connected to said source, and a drain; and
   a second NMOS transistor having a source for said second signal end, a gate connected to said gate of said first NMOS transistor and said source of said first NMOS transistor, and a drain;

said drain of said first NMOS transistor and said drain of said second NMOS transistor connected together to form said input end.

9. The built-in current sensor according to claim 1, wherein said second current mirror consists of a first PMOS transistor having a drain for said second signal end, a gate, and a source connected to the power source; and a second PMOS transistor having a drain for said first signal end, a gate connected to said gate of said first NMOS transistor and said drain, and a source connected to the power source.

10. The built-in current sensor according to claim 1, wherein said second current mirror consists of a first PMOS transistor having a source for said second signal end, a gate, and a drain connected to the power source; and a second PMOS transistor having a source for said first signal end, a gate connected to said gate of said first NMOS transistor and said source, and a drain connected to the power source.

11. The built-in current sensor according to claim 1, wherein said multiplexer consists of said first switch and said second switch.

12. A built-in current sensor for measuring the current of a CMOS circuit under test (CUT), said sensor consisting essentially of:

a reference current generator having
a control end connected to an external reference voltage,
an input end connected to a power source, and
an output end;

a first current mirror having
an input signal end connected to ground,
a first signal end connected to said output end of said reference current generator, and
a second signal end;

a second current mirror having
an input end connected to the power source,
a first signal end, and
a second signal end connected to said second signal end of said first current mirror;

an inverter connected to said second signal end of said first current mirror and said second signal end of said second current mirror, whereby said inverter outputs a first logic value when the inputted current from said second signal end of said first current mirror and said second signal end of said second current mirror is greater than zero, said inverter outputs a second logic value when the inputted current from said second signal end of said first current mirror and said second signal end of said second current mirror is less than zero; and a multiplexer having a first switch including a control end connected to a first input signal, a first signal end connected to the external reference voltage, and a second signal end connected to the circuit under test (CUT), and a second switch including a control end connected to a second input signal, a first signal end connected to the circuit under test (CUT), and a second signal end connected to said first signal end of said second current mirror.

* * * * *